United States Patent
Anthony et al.

(10) Patent No.: US 6,936,903 B2
(45) Date of Patent: Aug. 30, 2005

(54) MAGNETIC MEMORY CELL HAVING A SOFT REFERENCE LAYER

(75) Inventors: Thomas C. Anthony, Sunnyvale, CA (US); Manish Sharma, Mountain View, CA (US); Manoj K. Bhottacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 140 days.

(21) Appl. No.: 10/692,546

(22) Filed: Oct. 24, 2003

(65) Prior Publication Data

US 2004/0092039 A1 May 13, 2004

Related U.S. Application Data

(60) Continuation-in-part of application No. 10/351,013, filed on Jan. 25, 2003, now Pat. No. 6,891,746, which is a division of application No. 09/963,171, filed on Sep. 25, 2001, now Pat. No. 6,576,969.

(51) Int. Cl.[7] .......................... H01L 43/00; G11C 11/00; G11C 11/14

(52) U.S. Cl. .......................... 257/422; 365/158; 365/171
(58) Field of Search .................................. 257/421–427; 365/145, 158, 171, 173, 213, 232

(56) References Cited

U.S. PATENT DOCUMENTS

| 5,936,293 | A | * | 8/1999 | Parkin ........................ 257/422 |
| 6,404,674 | B1 | | 6/2002 | Anthony et al. |
| 6,538,917 | B1 | | 3/2003 | Tran et al. |
| 6,570,783 | B1 | | 5/2003 | Deak |
| 6,576,969 | B2 | | 6/2003 | Tran et al. |

OTHER PUBLICATIONS

Cowburn, et al., "Sensing Magnetic Fields Using Superparamagnetic Nanomagnets," May 1, 2000, Journal of Applied Physics, vol. 87, No. 9, pp. 7082–7084.

* cited by examiner

*Primary Examiner*—David Nelms
*Assistant Examiner*—Long Tran

(57) ABSTRACT

An exemplary magnetic memory cell comprises a data layer, a soft reference layer having a lower magnetic energy than the data layer, and spacer layer between the data layer and the soft reference layer.

29 Claims, 8 Drawing Sheets

MAGNETIC MEMORY CELL HAVING A SOFT REFERENCE LAYER

RELATED APPLICATIONS

This patent is a continuation-in-part of, and claims priority to, the U.S. patent application bearing Ser. No. 10/351,013 now U.S. Pat. No. 6,891,746, which is a divisional application of a U.S. patent application bearing Ser. No. 09/963,171 now issued as U.S. Pat. No. 6,576,969 B2.

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read from or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. In a magnetic memory cell, a bit of data (e.g., a "1" or "0") may be stored by "writing" into the data layer via one or more conducting leads (e.g., a bit line and a word line). A typical data layer might be made of one or more ferromagnetic materials. The write operation is typically accomplished via one or more write currents that set the orientation of the magnetic moment in the data layer to a predetermined direction (hereinafter "magnetic orientation").

Once written, the stored bit of data may be read by providing a read current through one or more conducting leads (e.g., a read line) to the magnetic memory cell. For each memory cell, the magnetic orientations of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic orientations are parallel, the resistance determined based on the output current is of a first relative value (e.g., relatively low). If the magnetic orientations are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects.

Still other configurations of magnetic memory cells are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory cells as first described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

The relative resistance between a reference layer and a data layer of a magnetic memory cell may be more efficiently and definitively ascertained if the magnetic orientation of the reference layer can be "pinned-on-the-fly" (i.e., by applying a current to pin the reference layer to a known magnetic orientation when one wishes to read a bit). Various exemplary embodiments of pinned-on-the-fly reference layers are described in more detail in U.S. Pat. No. 6,404,674, issued to Anthony et al. and assigned to the assignee of the present application. This patent is hereby incorporated by reference for all purposes. One way to make magnetic memory cells with reference layers that can be pinned-on-the-fly is to make the reference layers magnetically soft (i.e., layers whose magnetic orientation is easy to switch).

Thus, a market exists for magnetic memory cells having reference layers whose magnetic orientation is easy to switch.

SUMMARY

An exemplary magnetic memory cell comprises a data layer, a soft reference layer having a lower magnetic energy than the data layer, and a spacer layer between the data layer and the soft reference layer.

An exemplary method for making magnetic memory cell having a soft reference layer comprises forming a data layer, forming a soft reference layer having lower magnetic energy than the data layer, and forming a spacer layer between the data layer and the soft reference layer.

Other embodiments and implementations are also described below.

DETAILED DESCRIPTION

I. Overview

Exemplary magnetic memory cells having a soft reference layer, and manufacturing processes for making the magnetic memory cells, are described herein.

Section II describes in general the use of soft reference layers in magnetic memory cells.

Section III describes a first exemplary magnetic memory cell.

Section IV describes a second exemplary magnetic memory cell.

Section V describes a third exemplary magnetic memory cell.

Section VI describes an exemplary process for making the first exemplary improved magnetic memory cell.

Section VII describes an exemplary process for making the first exemplary improved magnetic memory cell.

Section VIII describes an exemplary process for making the first exemplary improved magnetic memory cell.

Section IX describes various other considerations associated with magnetic memory cells.

II. Magnetic Memory Cells Having Soft Reference Layers

A. Overview of Soft Magnetic Behavior

A layer of magnetic material is said to exhibit "soft" magnetic behavior when its magnetic orientation can be reversibly switched by a small magnetic field. A layer of magnetic material may be soft as a result of its chemical composition, size, shape, or even the temperature of the material during measurement.

A superparamagnetic material is one example of a magnetic material that can be "ultra-soft". An ultra-soft material generally has no set magnetic orientation when no magnetic field is being applied. The ultra-soft material has extremely low coercivity and may only require a very small amount of magnetic field to switch its magnetic orientation one way or another.

B. Applying Soft Magnetic Materials to Magnetic Memory Cells

Soft magnetic materials are useful in magnetic memory cells to improve switching characteristics of the memory cells. For example, a soft data layer generally requires a lower switching current than a hard data layer during a write operation. However, the data layer should not be too soft. It is desirable to make the data layer hard enough to retain the magnetic orientation "written" into the layer. Many uses of the soft magnetic materials in magnetic memory cells have been disclosed in U.S. Pat. No. 6,404,674 (issued to Anthony et al.) and U.S. Pat. No. 6,538,917 (issued to Tran et al.), which are hereby incorporated by reference for all purposes.

C. Applying Soft Magnetic Materials to Reference Layers in Magnetic Memory Cells In a magnetic memory cell implementing a soft reference layer (as opposed to a pinned or hard reference layer), the coercivity of the reference layer is typically much lower than the coercivity of the data layer. For example, in many exemplary magnetic memory cells, the coercivity of the data layer might be 2–5 times greater than the coercivity of the reference layer. When implementing a soft reference layer in a magnetic memory cell, the reference layer can be set into a known magnetic orientation with small magnetic fields generated by currents provided by conductors adjacent to the magnetic memory cell. Such currents are lower than the switching current needed to write a bit in the data layer. Lower current consumption may result in reduced operating power.

D. Making a Reference Layer "Soft" by Reducing Its Magnetic Energy

In a magnetically soft layer, very small magnetic field (or current) can cause the magnetic orientation in the layer to change direction. If used appropriately, this attribute can be desirable in the reference layer. Generally, a magnetic material is rendered "soft" by reducing its magnetic energy, which is proportional to K, the sum of all anisotropies of the magnetic layer (typically anisotropy includes, without limitation, shape anisotropy, magnetocrystalline anisotropy, and magnetoelastic anisotropy). When magnetic elements are patterned to sub-micrometer dimensions, shape anisotropy often dominates, so controlling shape anisotropy is important in creating a soft, patterned magnetic element.

1. Reducing Magnetic Energy in a Reference Layer by Reducing Shape Anisotropy When designing a soft reference layer, one may consider making a layer with a small shape anisotropy. In general, the smaller the difference between major and minor axes of a planar shape, the smaller the shape anisotropy. For example, a circle, whose major and minor axes are equal to its diameter d, has no shape anisotropy. A square of width d has a smaller shape anisotropy than a rectangle of width d. As the dimensions of a layer become smaller, the shape anisotropy (Ks) of an elongated shape increases rapidly. Thus, reducing shape anisotropy (e.g., by adapting circular shapes) is especially beneficial for small patterned layers.

2. Reducing Magnetic Energy in a Reference Layer by Reducing Magnetocrystalline Anisotropy Choice of ferromagnetic alloy can also be an important consideration when creating a soft reference layer. The magnetic field required to saturate the magnetization along an applied field axis is generally proportional to the magnetic anisotropy. Therefore, implementing low magnetocrystalline anisotropy in a soft reference layer may allow the magnetization of the soft reference layer to respond to lower magnetic fields. Larger fields are necessary to alter magnetization orientation in higher anisotropy materials. Examples of materials having low magnetocrystalline anisotropy include NiFe, CoFe, and amorphous ferromagnetic alloys (e.g., CoFeB, CoZrNb).

3. Reducing Magnetic Energy in a Reference Layer by Reducing Volume

As the volume V of a patterned magnetic layer is reduced, the total magnetic energy, KV, of the layer decreases and eventually approaches the thermal energy, $k_B T$, of the layer. Here $k_B$ is the Boltzmann constant and T is the absolute temperature. When the ratio of magnetic energy to thermal energy ($KV/k_B T$) in a layer of material is less than a threshold value (e.g., about 50), the layer of material may become less thermally stable and its magnetic orientation may become susceptible to reorientation due to thermal fluctuations. One manifestation of the onset of thermal instability is a reduction in coercivity, which can be used to advantage in a soft-reference layer. Further reduction of the volume of a layer (e.g., reducing the ratio between KV and $k_B T$ to about 5), may place the layer in a superparamagnetic, ultra-soft, state. Prior to reaching the superparamagnetic state, thermal energy may facilitate switching of magnetic orientation, making the layer softer.

Based on the foregoing, reducing the volume of a layer (e.g., by reducing its area and/or thickness) may be considered in the design of a soft reference layer. Patterning the soft reference layer into a thinner layer (especially in combination with a small circular shape) may make the reference layer ultra-soft.

Of course, one can also use any combination of the above techniques to create a soft reference layer depending on the specific requirements of a particular implementation. Sections III–V below illustrate exemplary magnetic memory cells applying one or more of the above techniques to reduce magnetic energy in the reference layer and render it magnetically soft. Sections VI–VIII below describe processes for making those exemplary magnetic memory cells.

E. What About the Data Layer?

The data layer may be patterned differently than the reference layer so that the data layer may maintain its magnetic hardness by, for example, having a larger shape anisotropy or volume. This may be desirable to ensure that the data layer will retain its magnetic orientation once written.

III. A First Exemplary Memory Cell

Figure 1:
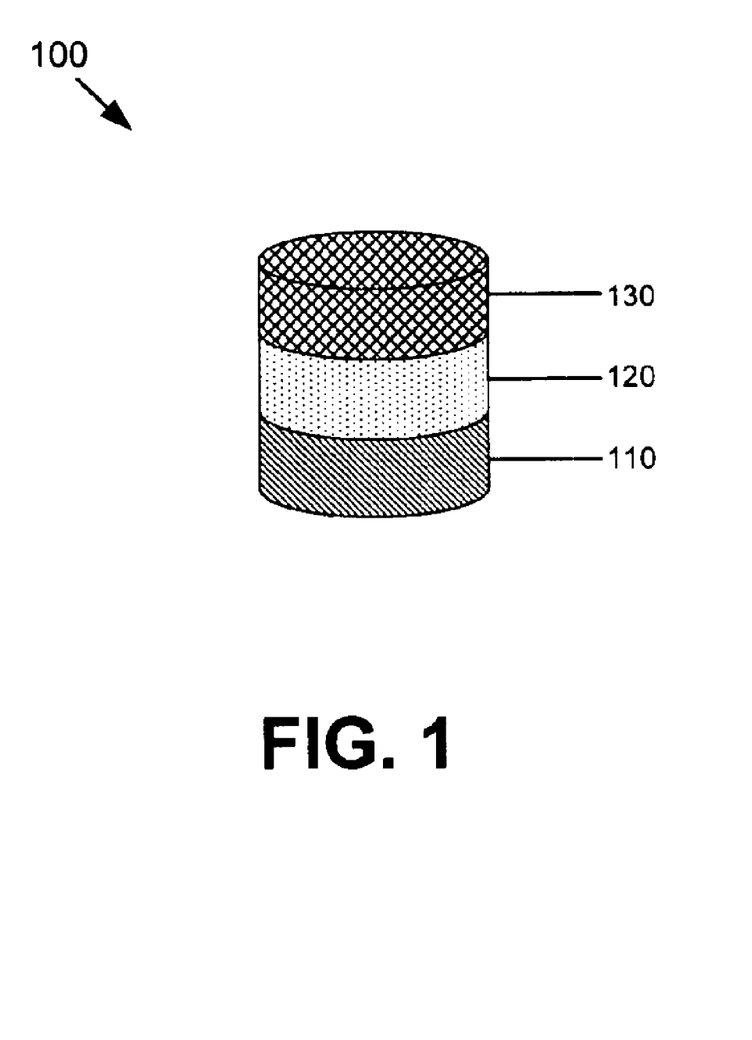
FIG. 1 illustrates a first exemplary magnetic memory cell having a soft reference layer.

FIG. 1 illustrates an elevation view of an exemplary magnetic memory cell 100 having a soft reference layer. Generally, a memory cell may be made as top-pinned (where the reference layer is on top of the data layer) or bottom-pinned (where the reference layer is below the data layer). For ease of explanation, only the top-pinned configuration is shown in FIG. 1 and referenced in the description of various exemplary embodiments herein. However, this configuration is merely illustrative. Thus, one skilled in the art will readily appreciate that other configurations (e.g., bottom-pinned, etc.) may also be implemented using the exemplary processes disclosed herein in accordance with any particular design requirement.

The memory cell 100 includes a data layer 110, a spacer layer 120, and a reference layer 130. The reference layer 130 has a lower magnetic energy than the data layer 110. The data and reference layers typically make contact with a pair of respective conductors (not shown) that are orthogonal to each other and are collectively used for both write and read operations. In some implementations, one or more conductors may also be considered as a part of the magnetic memory cell 100.

One skilled in the art will recognize that the memory cell configuration as illustrated in FIG. 1 is merely illustrative. Other configurations, for example, configurations having additional layers are also known in the art. For example, another magnetic memory cell configuration may also include a seed layer, a protective cap layer, and/or other layers. The seed layer generally enhances crystalline alignment of other nearby ferromagnetic layer(s). Exemplary materials for a seed layer include Ta, Ru, NiFe, Cu, or combinations of these materials. The protective cap layer protects the data layer 110 from the environment (e.g., by reducing oxidation of the data layer 110) and may be formed using any suitable material known in the art, for example, Ta, TaN, Cr, Al or Ti. For ease of explanation, these additional layers are not shown in the Figures; however, magnetic memory cells having one or more of these additional layers may be implemented with various embodiments to be described herein in accordance with a particular design choice.

The data layer 110 may comprise one or more ferromagnetic materials. In an exemplary embodiment, ferromagnetic materials suitable for the data layer 110 include, without limitation, NiFe, NiFeCo, CoFe, amorphous alloys (e.g., CoFeB, CoZrNb), and still other materials. The data layer can be a single layer of ferromagnetic material, or multiple layers separated by non-magnetic layers.

In an exemplary embodiment, the spacer layer 120 is a tunnel barrier layer (e.g., if the memory cell 100 is a TMR memory cell). In this embodiment, the spacer layer 120 may be made of $SiO_x$, $SiN_x$, MgO, $AlO_x$, $AlN_x$, $TaO_x$, and/or other insulating materials.

In another exemplary embodiment, the spacer layer 120 is a non-magnetic conducting layer (e.g., if the memory cell 100 is a GMR memory cell). In this embodiment, the spacer layer 120 may be made of Cu, Au, Ag, and/or other non-magnetic conducting materials.

The reference layer 130 may comprise a single layer of material or multiple layers of materials. For example, the reference layer 130 may comprise one or more ferromagnetic materials. In an exemplary embodiment, ferromagnetic materials suitable for the reference layer 130 include NiFe, NiFeCo, CoFe, amorphous ferromagnetic alloys (e.g., CoFeB, CoZrNb), and other materials. The reference layer can be a single layer of ferromagnetic material, or multiple layers separated by non-magnetic layers.

In an exemplary implementation, the data layer 110 is thicker (and thus has a greater volume) than the reference layer 130. The magnetization state of such a data layer 110 would be more thermally stable than a reference layer 130 of the same cross-sectional area and made of the same material. More generally, the data layer and the reference layer may be made of the same or different materials and sizes.

In an exemplary implementation, the data layer 110, spacer 120, and the reference layer 130 are patterned to a circular, or a low aspect ratio oval, elliptical, and/or other rounded shape that provides a relatively smaller shape anisotropy for the reference layer 130 and the data layer 110. In this implementation, the aspect ratio, defined as length divided by width, can be less than 2. If the volume of reference layer is made sufficiently small through a combination of small planar area and film thickness, then the reference layer can become superparamagnetic. In this case the reference layer magnetization can be oriented by a very small magnetic field.

In an exemplary implementation, the data layer 110 has a larger magnetocrystalline anisotropy than the reference layer 130, thereby rendering the data layer 110 magnetically harder. Hence, one level of magnetic field may orient the magnetization in the reference layer, and another higher level of magnetic field may orient the magnetization of the data layer.

An exemplary process for making the memory cell 100 will be described in Section VI below.

IV. A Second Exemplary Magnetic Memory Cell

Figure 2:
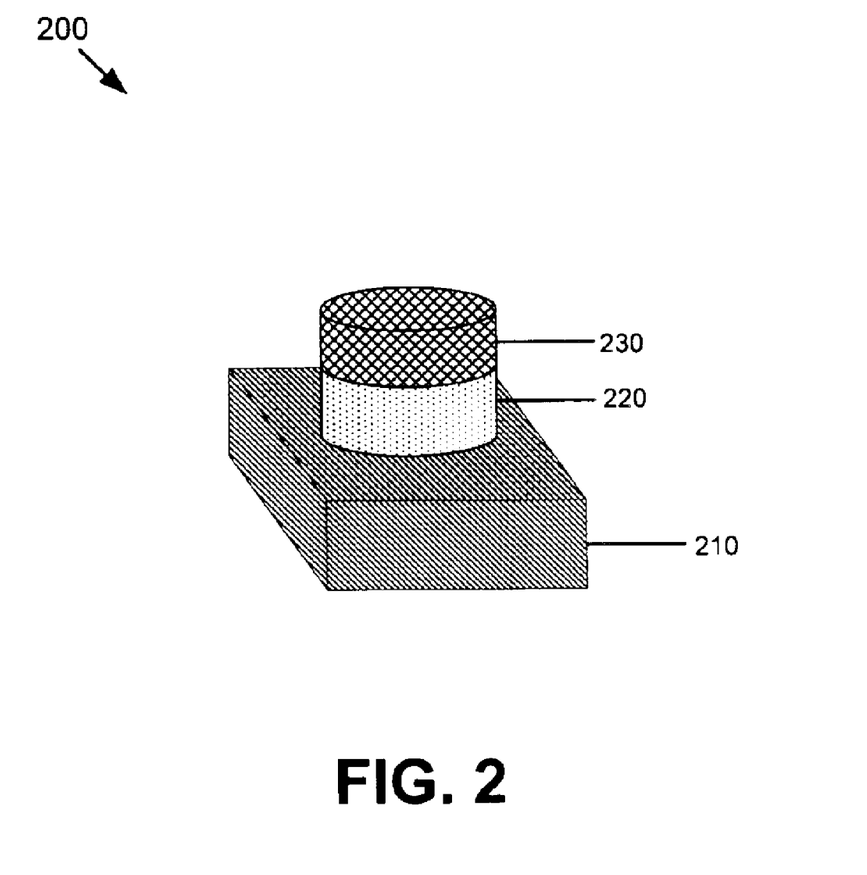
FIG. 2 illustrates a second exemplary magnetic memory cell having a soft reference layer.

FIG. 2 illustrates an elevation view of an exemplary magnetic memory cell 200. The magnetic memory cell 200 includes a larger volume (e.g., wider and thicker) data layer 210 relative to the soft reference layer 230. This configuration may provide a more magnetically stable data layer 210 and may reduce the effects of the fringe demagnetizing fields emanating from the edges of the data layer 210 from affecting the switching magnetic fields of the reference layer 230. Typically, fringe demagnetizing fields from one layer will increase the required switching magnetic fields of another layer. However, an offset at the edges between the layers (e.g., making one layer slightly smaller than the other) may reduce the effect of fringe demagnetizing fields from the larger layer on the smaller layer. For ease of explanation, only the top-pinned configuration is shown in FIG. 2 and referenced to in the description of various exemplary embodiments herein.

One skilled in the art will recognize that the memory cell configuration as illustrated in FIG. 2 is merely illustrative.

Other configurations, for example, configurations having additional conductor(s) and/or configurations having other additional layers are also known in the art. For ease of explanation, additional layers are not shown in the Figure; however, magnetic memory cells having one or more additional layers may be implemented with various embodiments to be described herein in accordance with a particular design choice. Further, a person skilled in the art will readily recognize that the shapes of the layers 210–230 in a memory cell are merely illustrative. The shape at which a layer is being patterned depends upon the masking process. Thus, during a particular masking process, the shape of one or more layers in the memory cell may be made different than another layer of the memory cell by applying an additional etching step (e.g., plasma etching, wet etching, etc.) to etch such one or more layers and/or a heating step to cause the mask layer to change shape (e.g., by causing "reflow" of the mask layer material) before resuming etch of such one or more layers.

Returning now to FIG. 2, the memory cell 200 includes a data layer 210, a spacer layer 220, and a reference layer 230. The reference layer 230 has a lower magnetic energy than the data layer 210. The data and reference layers typically make contact with a pair of respective conductors (not shown) that are orthogonal to each other and are collectively used for both write and read operations.

The data layer 210 may comprise one or more ferromagnetic materials. In an exemplary embodiment, ferromagnetic materials suitable for the data layer 210 include, without limitation, NiFe, NiFeCo, CoFe, amorphous alloys (e.g., CoFeB, CoZrNb), and still other materials. The data layer can be a single layer of ferromagnetic material, or multiple layers separated by non-magnetic layers.

In an exemplary embodiment, the spacer layer 220 is a tunnel barrier layer (e.g., if the memory cell 200 is a TMR memory cell). In this embodiment, the spacer layer 220 may be made of $SiO_x$, $SiN_x$, MgO, $AlO_x$, $AlN_x$, $TaO_x$, and/or other insulating materials.

In another exemplary embodiment, the spacer layer 220 is a non-magnetic conducting layer (e.g., if the memory cell 200 is a GMR memory cell). In this embodiment, the spacer layer 220 may be made of Cu, Au, Ag, and/or other non-magnetic conducting materials:

The reference layer 230 may comprise a single layer of material or multiple layers of materials. For example, the reference layer 230 may comprise one or more ferromagnetic materials. In an exemplary embodiment, ferromagnetic materials suitable for the reference layer 230 include NiFe, NiFeCo, CoFe, amorphous ferromagnetic alloys (e.g., CoFeB, CoZrNb), and other materials. The reference layer can be a single layer of ferromagnetic material, or multiple layers separated by non-magnetic layers.

In an exemplary implementation, the data layer 210 has a larger planar area than the reference layer 230. The magnetization state of such a data layer 210 would be more thermally stable than a soft reference layer 230 of the same thickness and made of the same material. While FIG. 2 indicates that spacer layer 220 and reference layer 230 have the same shape, it is not necessary to the design of the memory cell. One skilled in the art will readily appreciate that the size and shape of the spacer layer 220 and the reference layer 230 can vary depending on design choice.

In an exemplary implementation, the spacer layer 220 and the reference layer 230 are patterned to a circular, or a low aspect ratio (e.g., less than 2) oval, elliptical, and/or other shape that provides a relatively smaller shape anisotropy for the reference layer 230. The data layer 210 is patterned to an oval, elliptical, rectangular, and/or other shape that has a larger planar area than the reference layer 230. If the volume of reference layer is made sufficiently small through a combination of small planar area and film thickness, then the reference layer can become superparamagnetic. In this case the reference layer magnetization can be oriented by a very small magnetic field.

In an exemplary implementation, data layer 210 has a larger magnetocrystalline anisotropy than reference layer 230, thereby rendering data layer 210 magnetically harder. Hence, one level of magnetic field may orient the magnetization in the reference layer, and another higher level of magnetic field may orient the magnetization of the data layer.

An exemplary process for making the memory cell 200 will be described in Section VII below.

V. A Third Exemplary Magnetic Memory Cell

Figure 3:
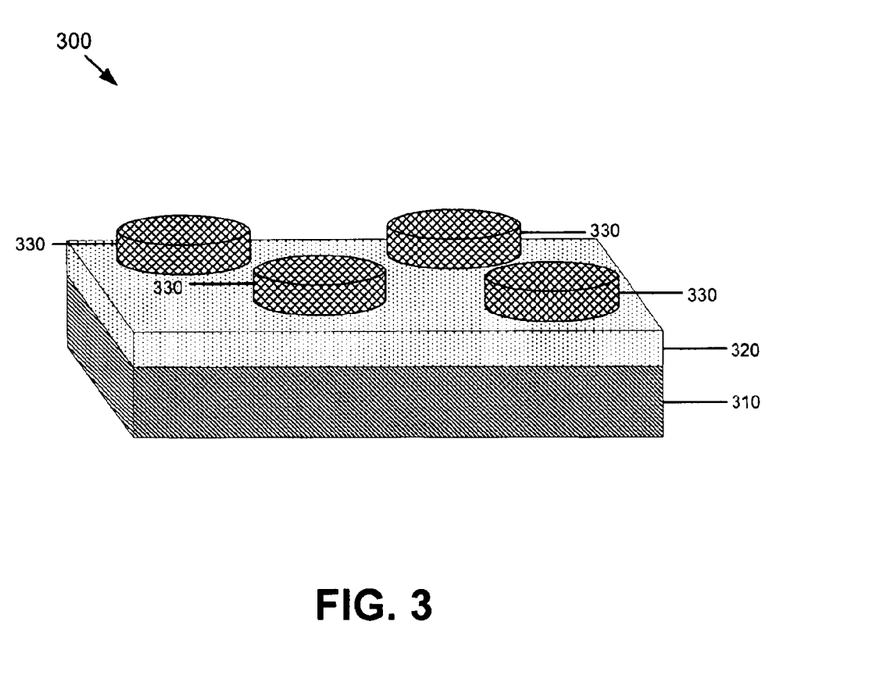
FIG. 3 illustrates a third exemplary magnetic memory cell having a soft reference layer.

FIG. 3 illustrates an elevation view of an exemplary magnetic memory cell 300. The magnetic memory cell 300 includes a larger volume (e.g., larger planar area) data layer 310 relative to the soft reference layer 330. This configuration may provide a more magnetically stable data layer 310 and may reduce the effects of the fringe demagnetizing fields emanating from the edges of the data layer 310 from affecting the switching magnetic fields of the reference layer 330. For ease of explanation, only the top-pinned configuration is shown in FIG. 3 and referenced to in the description of various exemplary embodiments herein.

One skilled in the art will recognize that the memory cell configuration as illustrated in FIG. 3 is merely illustrative. Other configurations, for example, configurations having additional conductor(s) and/or configurations having other additional layers are also known in the art. For ease of explanation, additional layers are not shown in the Figure; however, magnetic memory cells having one or more additional layers may be implemented with various embodiments to be described herein in accordance with a particular design choice.

Referring now to FIG. 3, the memory cell 300 includes a data layer 310, a spacer layer 320, and a reference layer 330. The reference layer 330 has a lower magnetic energy than the data layer 310. The data and reference layers typically make contact with a pair of respective conductors (not shown) that are orthogonal to each other and are collectively used for both write and read operations.

The data layer 310 may comprise one or more ferromagnetic materials. In an exemplary embodiment, ferromagnetic materials suitable for the data layer 310 include, without limitation, NiFe, NiFeCo, CoFe, amorphous alloys (e.g., CoFeB, CoZrNb), and still other materials. The data layer can be a single layer of ferromagnetic material, or multiple layers separated by non-magnetic layers.

In an exemplary embodiment, the spacer layer 320 is a tunnel barrier layer (e.g., if the memory cell 300 is a TMR memory cell). In this embodiment, the spacer layer 320 may be made of $SiO_x$, $SiN_x$, MgO, $AlO_x$, $AlN_x$, $TaO_x$, and/or other insulating materials.

In another exemplary embodiment, the spacer layer 320 is a non-magnetic conducting layer (e.g., if the memory cell 300 is a GMR memory cell). In this embodiment, the spacer layer 320 may be made of Cu, Au, Ag, and/or other non-magnetic conducting materials.

Each reference layer 330 may comprise a single layer of material or multiple layers of materials. For example, the reference layer 330 may comprise one or more ferromagnetic materials. In an exemplary embodiment, ferromagnetic materials suitable for the reference layer 330 include NiFe, NiFeCo, CoFe, amorphous ferromagnetic alloys (e.g., CoFeB, CoZrNb), and other materials. The reference layer can be a single layer of ferromagnetic material, or multiple layers separated by non-magnetic layers.

In an exemplary implementation, the data layer 310 has a larger planar area than the reference layer 330. The magnetization state of such a data layer 310 would be more thermally stable than a reference layer 330 of the same thickness and made of the same material. More generally, the data layer and reference layer may be made of the same or different materials and sizes. While FIG. 3 indicates that spacer layer 320 and data layer 310 have the same shape, it is not necessary to the design of the memory cell. One skilled in the art will readily appreciate that the size and shape of the spacer layer 320 and the reference layer 330 can vary depending on design choice.

In an exemplary implementation, the reference layer 330 is patterned to multiple small circular, or low aspect ratio (e.g., less than 2) oval, elliptical, and/or other shape dots that form small islands on top of the spacer layer 320. These small dots may have a shape anisotropy that is smaller than a single layer, for example, as compared to the reference layers as shown in FIGS. 1 and 2. The spacer layer 320 and data layer 310 are patterned to an oval, elliptical, rectangular, and/or other shape that gives the data layer 310 a larger shape anisotropy than the reference layer 330. If the volume of reference layer is made sufficiently small (e.g., by a combination of small planar area and film thickness), then the reference layer can become superparamagnetic. In this case the reference layer magnetization can be oriented by a very small magnetic field.

An exemplary process for making the memory cell 300 will be described in Section VIII below.

VI. An Exemplary Process for Making the First Exemplary Magnetic Memory Cell

Figure 4A:
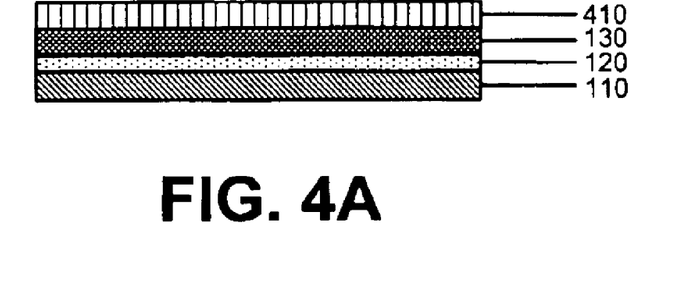
FIGS. 4A–4C illustrate an exemplary process for making the exemplary magnetic memory cell of FIG. 1.
Figure 4B:
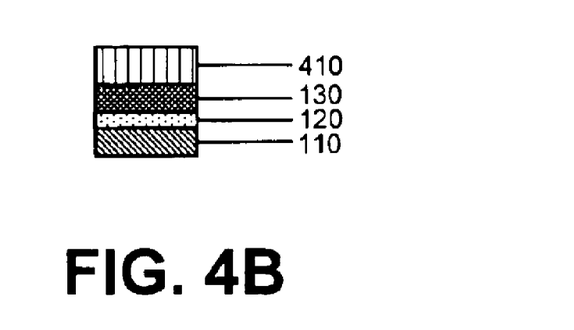
Figure 4C:
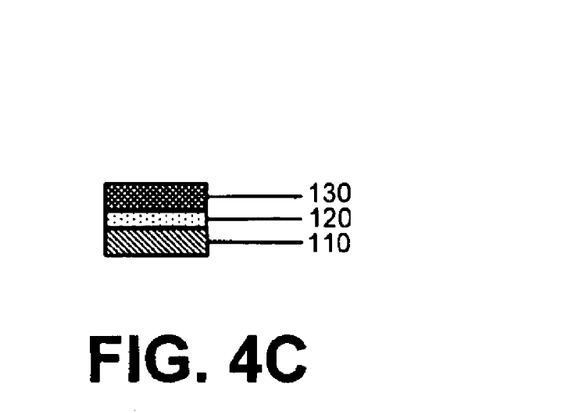

FIGS. 4A–4C illustrate an exemplary process for manufacturing the exemplary magnetic memory cell 100 as shown in FIG. 1.

In FIG. 4A, a data layer 110, a spacer layer 120, and a reference layer 130 (i.e., the magnetic memory cell 100 of FIG. 1) are formed by deposition and/or other techniques known in the art (e.g., via sputtering, evaporation, chemical vapor deposition, atomic layer deposition (ALD), and/or other known techniques). In addition, a mask layer 410 is formed on the reference layer 130. In an exemplary implementation, the mask layer includes photoresist material.

In FIG. 4B, the mask layer 410 is patterned by techniques known in the art. The data layer 110, spacer layer 120, and the reference layer 130 are etched using the patterned mask layer 410. Processes such as ion milling, reactive ion etching, wet chemical etching, and/or other known processes may be used to etch the layers of the memory cell. In an exemplary implementation, the mask layer 410 is patterned to a circular or other shape that provides a relatively smaller shape anisotropy.

In FIG. 4C, the patterned mask layer 410 is removed by dry or wet etching or other techniques known in the art.

Those skilled in the art will readily recognize that conducting layers (not shown) may also be formed and patterned to form one or more conductors near, on top of, or below, the magnetic memory cell. For example, a conductor may be formed below the data layer 110 using electroplating or other suitable deposition process then planarized by a planarizing process such as chemical mechanical planarization (CMP). The conductors will make electrical contact to the magnetic memory cell, in accordance with configurations known in the art, to provide currents during read and write operations.

The manufacturing steps illustrated above are merely exemplary. Those skilled in the art will appreciate that other manufacturing steps may be used in accordance with the requirements of a particular implementation. For example, the various layers as illustrated in FIGS. 4A–4C may be formed in accordance with other manufacturing sequences (e.g., the reference layer 130 may be formed first in a bottom-pinned memory cell), one or more layers may be formed during the same process step, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 120 may be a non-magnetic conducting layer for constructing a GMR memory cell.

VII. An Exemplary Process for Making the Second Exemplary Magnetic Memory Cell FIGS. 5A–5F illustrate an exemplary process for manufacturing the exemplary magnetic memory cell 200 as shown in FIG. 2.

Figure 5A:
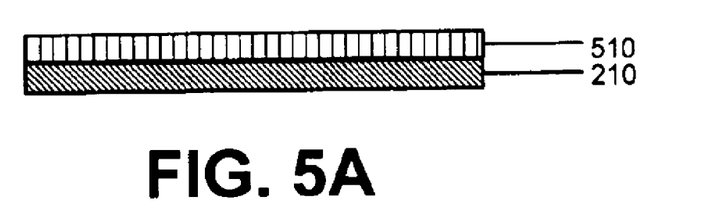
FIGS. 5A–5F illustrate an exemplary process for making the exemplary magnetic memory cell of FIG. 2.

In FIG. 5A, a data layer 210 is formed by deposition and/or other techniques known in the art (e.g., via sputtering, evaporation, chemical vapor deposition, atomic layer deposition (ALD), and/or other known techniques). In addition, a mask layer 510 is formed on the data layer 210. In an exemplary implementation, the mask layer 510 includes photoresist material.

Figure 5B:
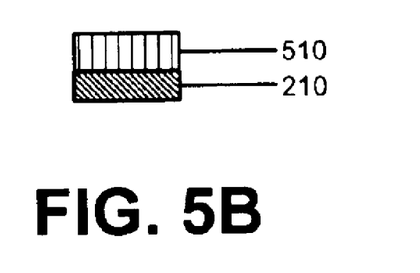

In FIG. 5B, the mask layer 510 is patterned by techniques known in the art then the data layer 210 is etched using the patterned mask layer 510. In an exemplary implementation, the mask layer 510 is patterned to an ellipse, rectangle, and/or other shape that is larger in planar area than the reference layer 230 (to be formed below).

Figure 5C:
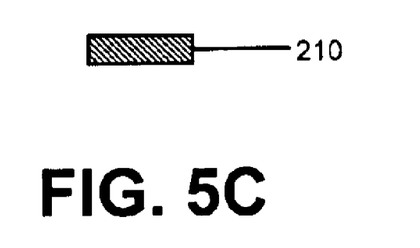

In FIG. 5C, the patterned mask layer 510 is removed by dry or wet etching or other techniques known in the art.

Figure 5D:
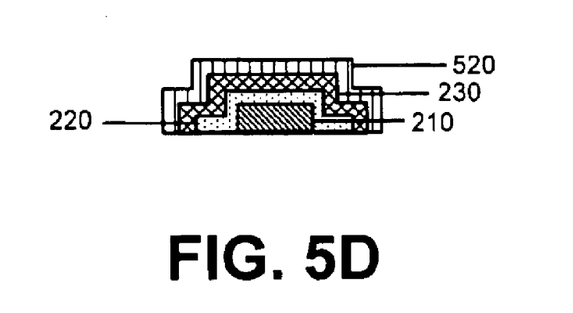

In FIG. 5D, a spacer layer 220 and a reference layer 230 are formed above the patterned data layer 210 by deposition and/or other techniques known in the art (e.g., via sputtering, evaporation, chemical vapor deposition, atomic layer deposition (ALD), and/or other known techniques). In addition, a mask layer 520 is formed on the reference layer 230. In an exemplary implementation, the mask layer 520 includes photoresist material.

Figure 5E:
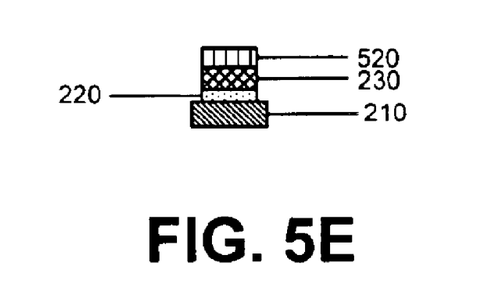

In FIG. 5E, the mask layer 520 is patterned to smaller dimensions than the data layer 210 by techniques known in the art. Next, the spacer layer 220 and the reference layer 230 are etched using the patterned mask layer 520. In an exemplary implementation, the mask layer 520 is patterned to a circular or low aspect ratio shape that provides a smaller shape anisotropy.

Figure 5F:
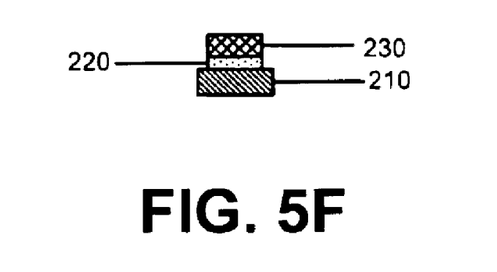

In FIG. 5F, the patterned mask layer 520 is removed by dry or wet etching or other techniques known in the art.

Those skilled in the art will readily recognize that conducting layers (not shown) may also be formed and patterned to form one or more conductors near, on top of, or below, the magnetic memory cell. For example, a conductor may be formed below the data layer 210 using electroplating or other suitable deposition process then planarized by a planarizing process such as chemical mechanical planarization (CMP). These one or more conductors will make electrical contact to the magnetic memory cell, in accordance with configurations known in the art, to provide currents during read and write operations.

The manufacturing steps illustrated above are merely exemplary. Those skilled in the art will appreciate that other manufacturing steps may be used in accordance with the requirements of a particular implementation. For example, the various layers as illustrated in FIGS. 5A–5F may be formed in accordance with other manufacturing sequences, one or more layers may be formed during the same process step, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 220 may be a non-magnetic conducting layer for constructing a GMR memory cell.

VIII. An Exemplary Process for Making the Third Exemplary Magnetic Memory Cell

FIGS. 6A–6F illustrate an exemplary process for manufacturing the exemplary magnetic memory cell 300 as shown in FIG. 3.

Figure 6A:
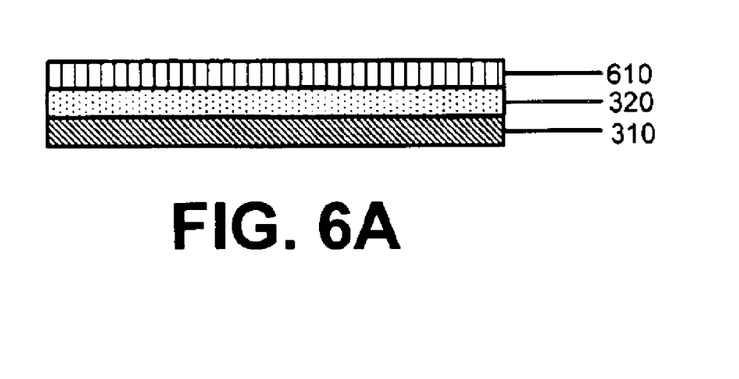
FIGS. 6A–6F illustrate an exemplary process for making the exemplary magnetic memory cell of FIG. 3.

In FIG. 6A, a data layer 310 and a spacer layer 320 are formed by deposition and/or other techniques known in the art (e.g., via sputtering, evaporation, chemical vapor deposition, atomic layer deposition (ALD), and/or other known techniques). In addition, a mask layer 610 is formed on the spacer layer 320 by techniques known in the art. In an exemplary implementation, the mask layer includes photoresist material.

Figure 6B:
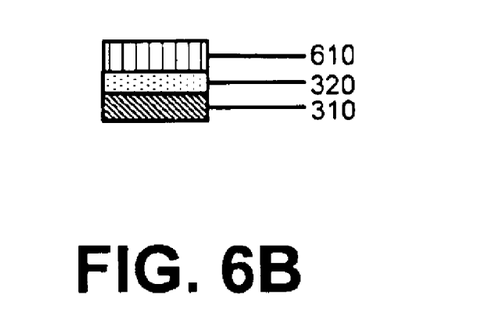

In FIG. 6B, the mask layer 610 is patterned by techniques known in the art then the data layer 310 and the spacer layer 320 are etched using the patterned mask layer 610. In an exemplary implementation, the mask layer 610 is patterned to an ellipse, rectangle, and/or other shape that is larger in planar area than the reference layer 330 (to be formed below).

Figure 6C:
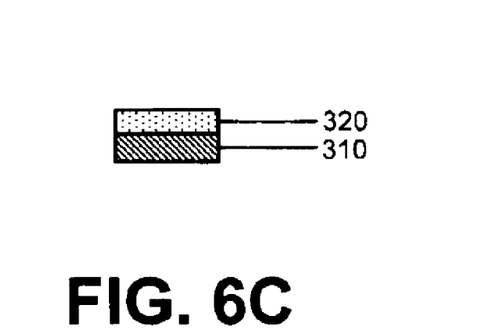

In FIG. 6C, the patterned mask layer 610 is removed by wet etching or other techniques known in the art.

Figure 6D:
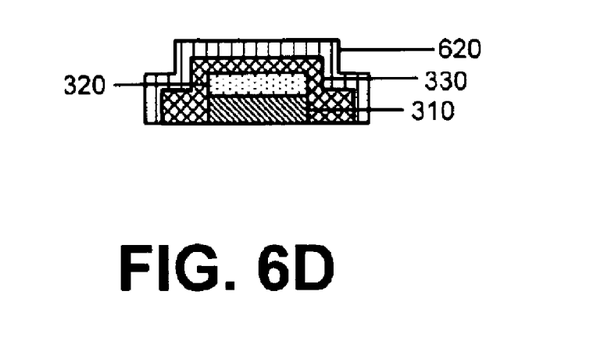

In FIG. 6D, a reference layer 330 is formed on the patterned spacer layer 320 by deposition and/or other techniques known in the art (e.g., via sputtering, evaporation, chemical vapor deposition, atomic layer deposition (ALD), and/or other known techniques). In addition, a mask layer 620 is formed on the reference layer 330 by techniques known in the art. In an exemplary implementation, the mask layer 620 includes resist material suitable for electron beam lithography known in the art.

Figure 6E:
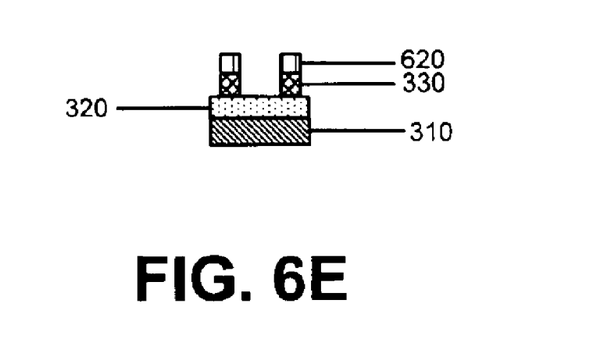

In FIG. 6E, the mask layer 620 is patterned to small dots relative to the data layer 310. Next, the reference layer 330 is etched using the patterned mask layer 620. The mask layer 620 can be patterned to circular, elliptical, oval, rectangular, square, triangular, irregular/amorphous, and/or other shape dots. In an exemplary implementation, the mask layer 620 is patterned by electron beam lithography whereby small dots are written onto the mask layer 620 by the electron beam. The patterned mask layer 620 then can be used to etch the reference layer 330 into small dots on the spacer layer 320.

Figure 6F:
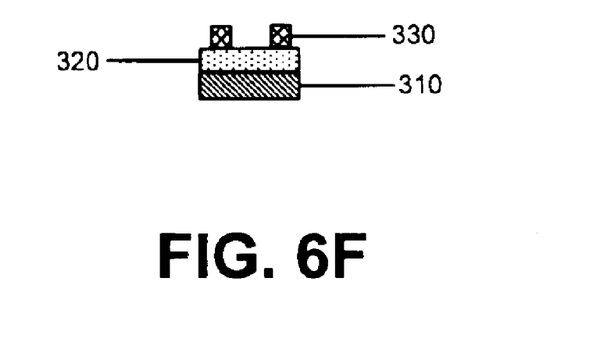

In FIG. 6F, the patterned mask layer 620 is removed by wet etching or other techniques known in the art.

In another exemplary implementation, the small dots can be created by implementing a controlled growth of the reference layer and a post-deposition treatment. The reference layer material in many magnetic memory cells is polycrystalline. Grain boundaries in polycrystalline materials typically are disordered and can have properties different from the bulk grain (e.g., resulting in a different etch rate or a different reaction rate than the bulk grain). If a polycrystalline reference layer is exposed to an etchant or reactant, grain boundaries can be removed or rendered magnetically inactive, thus, forming small, isolated reference layer dots. This isolation technique can be further facilitated by depositing polycrystalline grains that are dome-shaped (e.g., thicker at the center of a grain than at the grain's boundary). In this case, the grain boundary is thinner than the bulk of the grain, thereby simplifying the preferential removal or reaction of grain boundary material.

Those skilled in the art will readily recognize that conducting layers (not shown) may be formed and patterned to form one or more conductors near, on top of, or below, the magnetic memory cell. For example, a conductor may be formed below the data layer 310 using electroplating or other suitable deposition process then planarized by a planarizing process such as chemical mechanical planarization (CMP). These one or more conductors will make electrical contact to the magnetic memory cell, in accordance with configurations known in the art, to provide currents during read and write operations.

The manufacturing steps illustrated above are merely exemplary. Those skilled in the art will appreciate that other manufacturing steps may be used in accordance with the requirements of a particular implementation. For example, the various layers as illustrated in FIGS. 6A–6F may be formed in accordance with other manufacturing sequences, one or more layers may be formed during the same process step, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 320 may be a non-magnetic conducting layer for constructing a GMR memory cell.

IX. Other Considerations

A magnetically soft layer is characterized by relative ease of switching its magnetic orientation. For example, the magnetic orientation of a thin and small soft reference layer that is isolated from other magnetic layers (i.e., free from fringe demagnetizing fields from those other magnetic layers) can be easily switched by applying small magnetic fields. However, in practice, due to counter effects of demagnetizing fields from other nearby magnetic layers (e.g., data layers), that small and thin soft reference layer will require higher magnetic fields to switch its magnetic orientation. Thus, when designing various layers in magnetic memory cells, one has to take into consideration fringe demagnetizing fields generated by nearby magnetic layers during operation.

Depending on design choice, the fringe demagnetizing fields from a nearby magnetic layer (e.g., the data layer) may be reduced by: (1) providing yet another nearby magnetic layer to create a flux guide for the magnetic fields generated by the nearby magnetic layer (e.g., a ferromagnetic cladding around a conductor); (2) offsetting the soft reference layer from the edges of the nearby magnetic layer by at least a small margin as shown in FIGS. 2 and 3 above; (3) making the nearby magnetic layer a multi-layer magnetic layer that can capture its own fringe demagnetizing fields; and/or (4) applying other known techniques in accordance with the requirements of a particular implementation or design choice.

X. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A magnetic memory cell, comprising:
   a data layer;
   a soft reference layer having a lower magnetic energy than said data layer; and
   a spacer layer between said data layer and said reference layer.

2. The magnetic memory cell of claim 1, wherein said soft reference layer has a smaller anisotropy than said data layer.

3. The magnetic memory cell of claim 2, wherein said smaller anisotropy includes a smaller shape anisotropy.

4. The magnetic memory cell of claim 1, wherein a ratio of magnetic energy to thermal energy of said soft reference layer is less than 50.

5. The magnetic memory cell of claim 1, wherein said soft reference layer is superparamagnetic.

6. The magnetic memory cell of claim 1, wherein said soft reference layer substantially forms a shape having a low aspect ratio.

7. The magnetic memory cell of claim 1, wherein said soft reference layer substantially forms a circle.

8. The magnetic memory cell of claim 1, wherein said soft reference layer comprises a plurality of dots, each of which is smaller than said data layer.

9. The magnetic memory cell of claim 1, wherein said soft reference layer has a smaller volume than said data layer.

10. The magnetic memory cell of claim 1, wherein said soft reference layer has a smaller planar area than said data layer.

11. The magnetic memory cell of claim 1, wherein said soft reference layer is thinner than said data layer.

12. The magnetic memory cell of claim 1, wherein said soft reference layer is laterally narrower than said data layer.

13. The magnetic memory cell of claim 1, wherein said soft reference layer is more thermally unstable than said data layer.

14. The magnetic memory cell of claim 1, wherein said data layer comprises more than one layer of materials.

15. The magnetic memory cell of claim 1, wherein said data layer is proximate a ferromagnetic material that is configured to act as a flux guide for magnetic fields emanating from said data layer.

16. The magnetic memory cell of claim 15, wherein said ferromagnetic material is a cladding around a conductor.

17. A method for making magnetic memory cell having a soft reference layer, comprising:
   forming a data layer;
   forming a soft reference layer having a lower magnetic energy than said data layer; and
   forming a spacer layer between said data layer and said soft reference layer.

18. The method of claim 17, wherein said forming a soft reference layer comprises forming a layer having a smaller anisotropy than said data layer.

19. The method of claim 18, wherein said smaller anisotropy includes a smaller shape anisotropy.

20. The method of claim 19, wherein said forming a soft reference layer comprises patterning said soft reference layer to substantially form a shape having a low aspect ratio.

21. The method of claim 19, wherein said forming a soft reference layer comprises patterning said soft reference layer to substantially form a circle.

22. The method of claim 19, wherein said forming a soft reference layer comprises forming a plurality of dots, each of which is smaller than said data layer.

23. The method of claim 17, wherein said forming a soft reference layer comprises forming a soft reference layer having a smaller volume than said data layer.

24. The method of claim 17, wherein said forming a soft reference layer comprises forming a soft reference layer having a smaller planar area than said data layer.

25. The method of claim 17, wherein said forming a soft reference layer comprises forming a laterally narrower soft reference layer than said data layer.

26. The method of claim 17, wherein said forming a data layer comprises forming more than one layer of materials.

27. The method of claim 17, wherein said forming a data layer comprises forming a data layer near a ferromagnetic material that is configured to act as a flux guide for magnetic fields emanating from said data layer.

28. The magnetic memory cell of claim 27, wherein said ferromagnetic material is a cladding around a conductor.

29. A nonvolatile memory array comprising a plurality of magnetic memory cells, each of said magnetic memory cells being made by a process comprising:
   forming a data layer;
   forming a soft reference layer having a lower magnetic energy than said data layer; and
   forming a spacer layer between said data layer and said soft reference layer.

* * * * *